United States Patent
Wang et al.

(10) Patent No.: US 7,709,316 B2
(45) Date of Patent: *May 4, 2010

(54) METHOD OF FABRICATING GATE STRUCTURE

(75) Inventors: Yun-Ren Wang, Tainan (TW);
Ying-Wei Yen, Miaoli County (TW);
Shu-Yen Chan, Hsinchu County (TW);
Kuo-Tai Huang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/192,128

(22) Filed: Aug. 15, 2008

(65) Prior Publication Data

US 2008/0318405 A1 Dec. 25, 2008

Related U.S. Application Data

(63) Continuation of application No. 11/164,025, filed on Nov. 8, 2005, now Pat. No. 7,435,640.

(51) Int. Cl.
*H01L 21/8249* (2006.01)

(52) U.S. Cl. .......... 438/216; 438/261; 438/786; 257/E21.267

(58) Field of Classification Search .......... 438/216, 438/261, 287, 691, 786, 791, 792; 257/E21.267
See application file for complete search history.

(56) References Cited

U.S. PATENT DOCUMENTS 7,435,640 B2 * 10/2008 Wang et al. .......... 438/216

* cited by examiner

*Primary Examiner*—Thanhha Pham
(74) *Attorney, Agent, or Firm*—Chun-Ming Shih

(57) ABSTRACT

A method of fabricating a gate structure is provided. First, a sacrificial oxide layer is formed on a substrate. A nitridation treatment process is performed to redistribute the nitrogen atoms in the sacrificial layer and the substrate. Next, the sacrificial oxide layer is removed. A re-oxidation process is performed to produce an interface layer on the surface of the substrate. A high K (dielectric constant) gate dielectric layer, a barrier layer and a metal layer are sequentially formed on the substrate. The metal layer, the barrier layer, the high K gate dielectric layer and the interface layer are defined to form a stacked gate structure.

22 Claims, 3 Drawing Sheets

METHOD OF FABRICATING GATE STRUCTURE

CROSS-REFERENCE TO RELATED APPLICATION

This is a continuation application of patent application Ser. No. 11/164,025, filed on Nov. 8, 2005, which is now patented as U.S. Pat. No. 7,435,640. The entirety of the above-mentioned patent application is hereby incorporated by reference herein and made a part of this specification.

BACKGROUND OF THE INVENTION

1. Field of the Invention

The present invention relates to a semiconductor process. More particularly, the present invention relates to a gate structure and a method of fabricating the same.

2. Description of the Related Art

In most conventional semiconductor process, silicon oxide ($SiO_2$) is used to form the gate dielectric layer. With the rapid progress in the integrated circuit manufacturing industry, the design of circuit devices increasingly depends on miniaturization to increase the level of device integration and the driving capability of the devices. As the line width of gates is reduced, thickness of the gate dielectric layer must be reduced correspondingly. As a result, the chance of having a direct tunneling will increase leading to a rapid increase in the leakage current. To resolve this problem, a dielectric layer fabricated using a high dielectric constant (K) is demanded.

However, the integration of a high-K dielectric layer with transistors often encounters some technical difficulties because the use of a high-K material often results in a drop in mobility and device reliability. Moreover, as the thickness of the gate dielectric layer decreases, the phenomena of boron penetration and polysilicon gate depletion intensify. Boron penetration can be ameliorated through doping a small amount of nitrogen in the oxide layer. However, the effect of polysilicon gate depletion can hardly be avoided. Furthermore, the deployment of a high-K dielectric layer tends to increase the threshold voltage of a device and prevents the integration of the high-K dielectric layer with a polysilicon gate. Therefore, the method of replacing the polysilicon with a metal gate is proposed. Aside from avoiding polysilicon gate depletion, the metal gate can also lower parasitic resistance in the gate.

Yet, most gate structures comprising a high-K dielectric layer and a metal gate have poor dielectric layer/silicon substrate interface properties that will affect the operation and performance of the device.

SUMMARY OF THE INVENTION

Accordingly, at least one objective of the present invention is to provide a method of fabricating a gate structure that can prevent the problem of having inferior properties at the interface between a high K (dielectric constant) dielectric layer and a substrate and increase device performance.

At least another objective of the present invention is to provide a gate structure that can resolve the problem of having inferior properties at the interface between a high K dielectric layer and a substrate.

To achieve these and other advantages and in accordance with the purpose of the invention, as embodied and broadly described herein, the invention provides a method of fabricating a gate structure. First, a sacrificial oxide layer is formed on a substrate. A nitridation treatment process is performed to redistribute the nitrogen atoms in the sacrificial layer and the substrate. Thereafter, the sacrificial oxide layer is removed. Then, a re-oxidation process is performed to produce an interface layer on the surface of the substrate. After that, a high dielectric constant (high-K) gate dielectric layer, a barrier layer and a metal layer are sequentially formed on the substrate. The metal layer, the barrier layer, the high K gate dielectric layer and the interface layer are defined to form a stacked gate structure.

According to the embodiment of the present invention, the interface has a nitrogen concentration profile that progressively decreases toward the substrate, for example.

According to the embodiment of the present invention, the nitridation treatment process is a plasma nitridation treatment process, for example.

According to the embodiment of the present invention, the interface layer is a silicon oxynitride layer having a thickness smaller than 7 Å, for example. Furthermore, the interface layer with progressively decreasing nitrogen atom concentration toward the substrate has a nitrogen content between about 0.5~5%, for example.

According to the embodiment of the present invention, the high-K gate dielectric layer is fabricated using tantalum oxide ($Ta_2O_5$), zirconium oxide ($ZrO_2$), hafnium oxide ($HfO_2$), aluminum oxide ($Al_2O_3$), hafnium silicide (HfSi) or titanium oxide ($TiO_2$), for example. The high-K gate dielectric layer has a thickness between about 20 Å to 40 Å, for example.

According to the embodiment of the present invention, the metal layer is fabricated using aluminum (Al), platinum (Pt), tungsten (W), iridium (Ir), molybdenum (Mo), molybdenum nitride; (MoN), nickel (Ni), nickel silicide (NiSi), titanium (Ti), titanium nitride (TiN), titanium silicide (TiSi), tantalum (Ta) or tantalum nitride (TaN), for example.

According to the embodiment of the present invention, the barrier layer is fabricated using hafnium (Hf), titanium nitride (TiN), tantalum nitride (TaN) or titanium nitride/titanium (TiN/Ti), for example.

According to the embodiment of the present invention, the sacrificial oxide layer has a thickness between about 10 Å to 40 Å, for example.

The invention also provides a method of fabricating a gate structure. First, a sacrificial oxide layer is formed on a substrate. A nitridation treatment process is performed to redistribute the nitrogen atoms in the sacrificial layer and the substrate. Thereafter, a part of the sacrificial oxide layer is removed. Then, a re-oxidation process is performed to the sacrificial oxide layer and the surface of the substrate so as to form an interface layer on the surface of the substrate. After that, a high dielectric constant (high-K) gate dielectric layer, a barrier layer and a metal layer are sequentially formed on the substrate. The metal layer, the barrier layer, the high K gate dielectric layer and the interface layer are defined to form a stacked gate structure.

According to the embodiment of the present invention, the nitridation treatment process is a plasma nitridation treatment process, for example.

According to the embodiment of the present invention, the interface has a nitrogen concentration profile that progressively decreases toward the substrate, for example, for example.

According to the embodiment of the present invention, the interface layer is a silicon oxynitride layer having a thickness smaller than 7 Å, for example. Furthermore, the interface layer with progressively decreasing nitrogen atom concentration toward the substrate has a nitrogen content between about 0.5~5%, for example.

According to the embodiment of the present invention, the high-K gate dielectric layer is fabricated using tantalum oxide ($Ta_2O_5$), zirconium oxide ($ZrO_2$), hafnium oxide ($HfO_2$), aluminum oxide ($Al_2O_3$), hafnium silicide (HfSi) or titanium oxide ($TiO_2$), for example. The high-K gate dielectric layer has a thickness between about 20 Å to 40 Å, for example.

According to the embodiment of the present invention, the metal layer is fabricated using aluminum (Al), platinum (Pt), tungsten (W), iridium (Ir), molybdenum (Mo), molybdenum nitride (MoN), nickel (Ni), nickel silicide (NiSi), titanium (Ti), titanium nitride (TiN), titanium silicide (TiSi), tantalum (Ta) or tantalum nitride (TaN), for example.

According to the embodiment of the present invention, the barrier layer is fabricated using hafnium (Hf), titanium nitride (TiN), tantalum nitride (TaN) or titanium nitride/titanium (TiN/Ti), for example.

According to the embodiment of the present invention, the sacrificial oxide layer has a thickness between about 10 Å to 40 Å, for example.

The present invention also provides a gate structure. The gate structure comprises an interface layer, a high K (dielectric constant) gate dielectric layer, a barrier layer and a metal layer. The interface layer is disposed on the substrate and the high-K gate dielectric layer is disposed on the interface layer. The barrier layer is disposed on the high-K gate dielectric layer and the metal layer is disposed on the barrier layer.

According to the embodiment of the present invention, the interface layer is a silicon oxynitride layer having a thickness smaller than 7 Å, for example. Furthermore, the interface layer with progressively decreasing nitrogen atom concentration toward the substrate has a nitrogen content between about 0.5~5%, for example.

According to the embodiment of the present invention, the high-K gate dielectric layer is fabricated using tantalum oxide, zirconium oxide, hafnium oxide, aluminum oxide, hafnium silicide or titanium oxide, for example. The high-K gate dielectric layer has a thickness between about 20 Å to 40 Å, for example.

According to the embodiment of the present invention, the metal layer is fabricated using aluminum, platinum, tungsten, iridium, molybdenum, molybdenum nitride, nickel, nickel silicide, titanium, titanium nitride, titanium silicide, tantalum or tantalum nitride, for example.

According to the embodiment of the present invention, the barrier layer is fabricated using hafnium, titanium nitride, tantalum nitride or titanium nitride/titanium, for example.

In the present invention, the method of forming a sacrificial oxide layer and then removing it in a subsequent process is used to prevent the surface of the interface layer from receiving any damages so that the quality of the film layer is improved. Furthermore, because the area with a high concentration of nitrogen atoms can be removed leading to a lower concentration of nitrogen in the substrate after removing the sacrificial oxide layer, the concentration profile of the nitrogen is better control and prevents the reduction of electron mobility. Moreover, with the reduction in the concentration of nitrogen in the substrate, the concentration of nitrogen in the interface layer is lower so that the equivalent oxide thickness (EOT) is reduced. Ultimately, the performance of the device is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
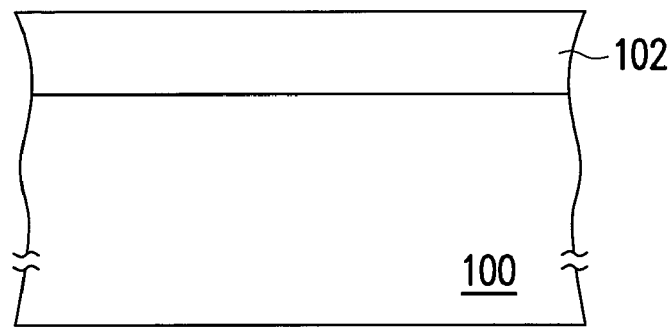
FIGS. 1A through 1F are schematic cross-sectional views showing the progression of steps for fabricating a gate structure according to the embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The method of fabricating a gate structure in the present invention includes forming an interface layer between a high dielectric constant (high-K) dielectric layer and a silicon substrate so that the problem of having inferior properties at the interface between a high-K dielectric layer and a silicon substrate is resolved. The conventional method includes forming an oxide layer over the silicon substrate and performing a plasma process to form the interface layer. As a result, the plasma may damage the surface of the interface layer and the oxide layer may re-grow. In another conventional method, a plasma nitridation process is performed before performing a re-oxidation process to form the aforesaid interface layer. Yet, this method may have difficulties controlling the distribution of atomic nitrogen and increasing the average concentration of nitrogen in the interface layer. Consequently, the mobility of the electrons in the gate structure may be seriously affected.

The present invention provides a method of fabricating a gate structure capable of producing an interface layer between a high-K dielectric layer and a silicon substrate. FIGS. 1A through 1F are schematic cross-sectional views showing the progression of steps for fabricating a gate structure according to the embodiment of the present invention.

First, referring to FIG. 1A, a sacrificial oxide layer 102 is formed on a substrate 100. The substrate 100 is a silicon substrate, for example. The sacrificial oxide layer 102 is formed, for example, by performing a chemical vapor deposition process. The sacrificial oxide layer 102 is a silicon oxide layer having a thickness between about 10 Å to 40 Å, for example.

Figure 1B:
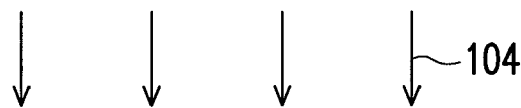
Figure 1B:
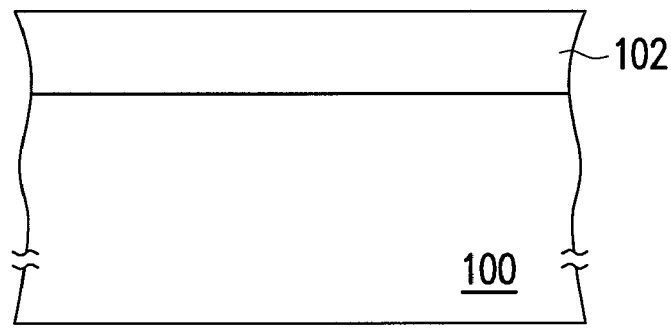

Referring to FIG. 1B, a nitridation treatment process 104 for the sacrificial oxide layer 102 is performed. The nitridation treatment process 104 can be a plasma nitridation treatment process performed with a power rating between 500~3500 W and a pressure between about 5~200 mT, for example.

Figure 2:
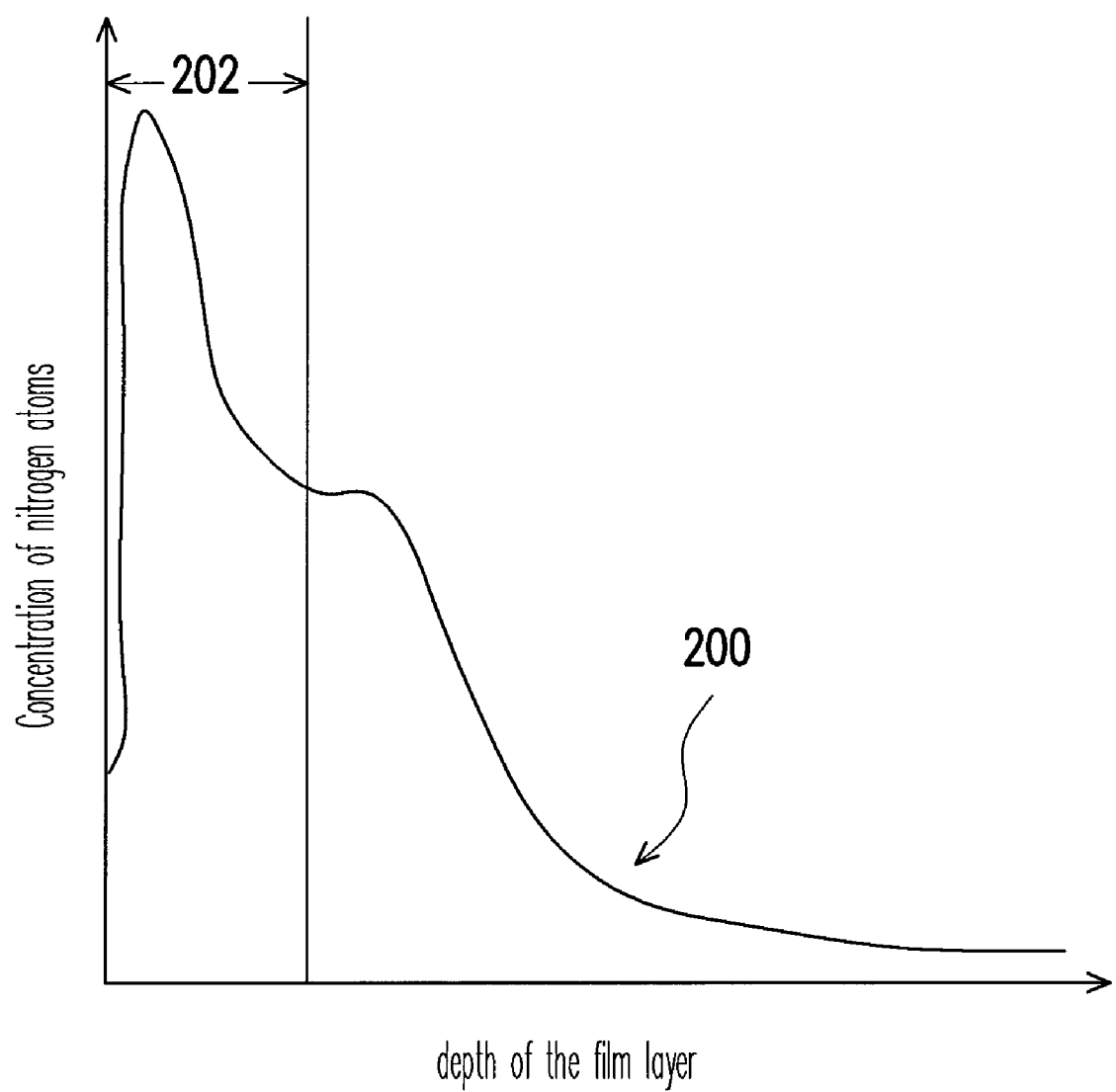
FIG. 2 is a graph showing the relationship between the concentration of atomic nitrogen and the depth of the film layer according to the present invention.

In particular, the reaction mechanism of the nitridation treatment process 104 includes channeling atomic nitrogen into the sacrificial oxide layer 102 and the substrate 100 for a reaction. FIG. 2 is a graph showing the relationship between the concentration of atomic nitrogen and the depth of the film layer according to the present invention. After performing the nitridation treatment process 104, the concentration of nitrogen in the sacrificial oxide layer 102 and the substrate 100 progressively increase and decrease toward the substrate 100. Furthermore, the concentration of nitrogen peaks inside the sacrificial oxide layer 102 (as shown by the curve 200 in FIG. 2).

Figure 1C:
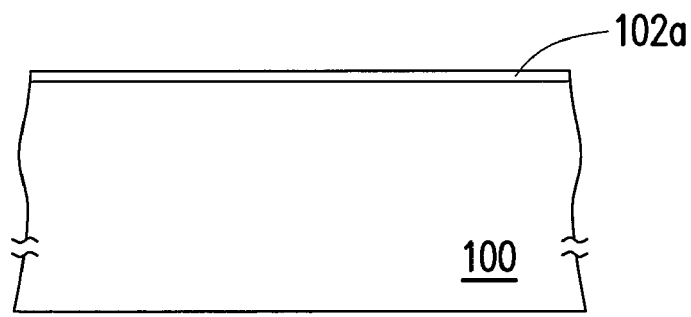

Referring to FIG. 1C, a part of the sacrificial oxide layer 102 having an increasing nitrogen concentration is removed to leave a sacrificial oxide layer 102a. The method of removing the sacrificial oxide layer 102 includes performing an etching process, for example. The etching process includes an isotropic etching process using an etchant such as a buffered hydrofluoric acid (buffered HF) solution or a diluted hydrofluoric acid (diluted HF) solution. It should be noted that the step of removing the sacrificial oxide layer 102 might also remove part of the layer (labeled 202 in FIG. 2) having an increasing nitrogen concentration so that the concentration of nitrogen progressively decreases in the substrate 100. Moreover, because the sacrificial oxide layer 102 is the layer where the concentration of nitrogen peaks, the concentration of nitrogen in the substrate 100 is relatively low after removing the sacrificial oxide layer 102.

In particular, the nitridation treatment process 104 in the present invention can be a plasma nitridation treatment process, for example. The plasma nitridation treatment process is different from an implantation method. The nitridation treatment process 104 of the present invention can produce a concentration profile for the nitrogen having a peak in the sacrificial oxide layer 102 while a nitridation treatment process using an implantation method will produce a concentration profile for the nitrogen with a peak in the substrate 100. Therefore, in the aforesaid embodiment, removing the sacrificial oxide layer 102 can remove the area with the highest concentration of nitrogen so that the substrate 100 can have a lower concentration of nitrogen. On the other hand, if the nitridation treatment process is an implant process, this goal can not be achieved.

Figure 1D:
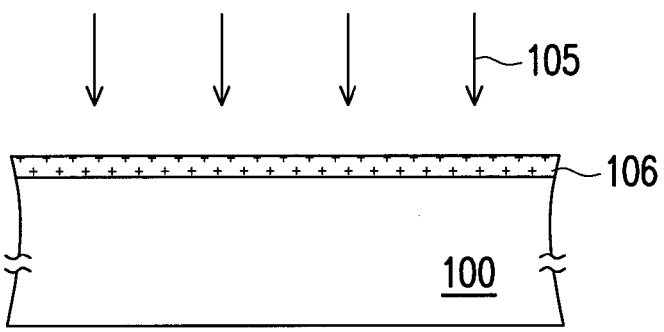

Referring to FIG. 1D, a re-oxidation process 105 is performed to form an interface layer 106 on the sacrificial oxide layer 102a and the surface of the sacrificial oxide layer 102. The re-oxidation process 105 is carried out at a temperature between 900~1000° C. and at a pressure of between 1~60 torrs so that oxygen or oxygen-containing gaseous mixture can react with the sacrificial oxide layer 102a and the substrate 100 to form a silicon oxynitride (SiON) layer serving as the interface layer 106. The interface layer 106 has a thickness smaller than 7 Å and the nitrogen content within the interface layer 106 is between 0.5~5%, preferably between 1.7~3.1%. Furthermore, the concentration of nitrogen in the substrate 100 decreases progressively. That is, the concentration of nitrogen on the surface of the substrate 100 is greater than the concentration of nitrogen near the bottom of the substrate 100. Hence, the interface layer 106 has a concentration gradient of nitrogen falling off toward the bottom of the substrate 100 after performing the re-oxidation process. Additionally, the removal of the sacrificial oxide layer 102 that carries the peak nitrogen concentration reduces the concentration of nitrogen in the substrate 100 so that the concentration of nitrogen at the surface of the interface layer 106 is smaller. Ultimately, the equivalent oxide thickness of the interface layer 106 is reduced leading to a higher device performance.

Figure 1E:
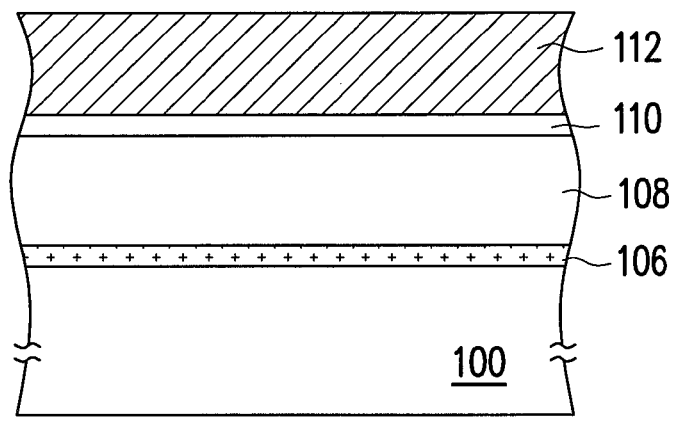

Referring to FIG. 1E, a high dielectric constant (K) gate dielectric layer 108, a barrier layer 110 and a metal layer 112 are sequentially formed over the interface layer 106. The high-K gate dielectric layer 108 is fabricated using tantalum oxide ($Ta_2O_5$), zirconium oxide ($ZrO_2$), hafnium oxide ($HfO_2$), aluminum oxide ($Al_2O_3$), hafnium silicide (HfSi) or titanium oxide ($TiO_2$), for example. The high-K gate dielectric layer has a thickness between about 20 Å to 40 Å, for example. The barrier layer 110 is fabricated using hafnium (Hf), titanium nitride (TiN), tantalum nitride (TaN) or titanium nitride/titanium (TiN/Ti), for example. The barrier layer 110 serves to increase high-temperature stability and prevent any reaction between the high-K gate dielectric layer 108 and the metal layer 112. The metal layer 112 is fabricated using aluminum (Al), platinum (Pt), tungsten (W), iridium (Ir), molybdenum (Mo), molybdenum nitride (MoN), nickel (Ni), nickel silicide (NiSi), titanium (Ti), titanium nitride (TiN), titanium silicide (TiSi), tantalum (Ta) or tantalum nitride (TaN), for example.

Figure 1F:
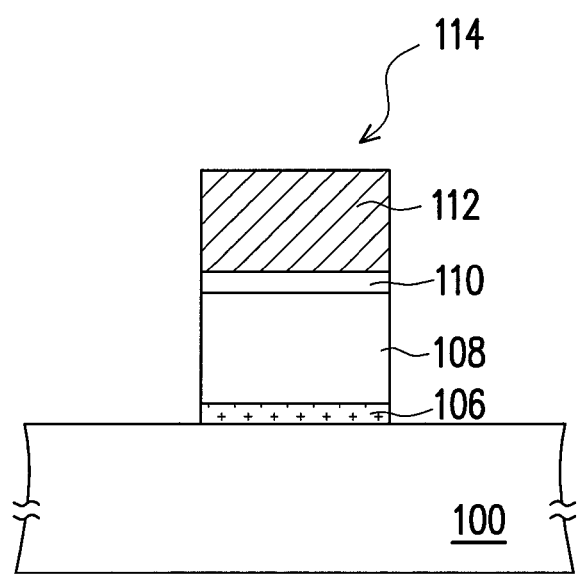

Referring to FIG. 1F, the metal layer 112, the barrier layer 110, the high-K gate dielectric layer 108 and the interface layer 106 are defined to form a stacked gate structure 114.

Obviously, after forming the stacked gate structure 114, source/drain regions and spacers can be formed to complete the fabrication of a semiconductor device. Since the process for forming the source/drain region and the spacers should be familiar to people skilled in this field, a detailed description is omitted.

In the following, a gate structure fabricated using the method of the present invention is described.

Referring to FIG. 1F, the stacked gate structure 114 comprises an interface layer 106, a high-K gate dielectric layer 108, a barrier layer 110 and a metal layer 112. The interface layer 106 is a silicon oxynitride layer having a thickness smaller than 7 Å, for example. Furthermore, the concentration of nitrogen decreases progressively toward the substrate 100 in the interface layer 106. The nitrogen content in the interface layer 106 is between 0.5~5%, but preferably between 1.7~3.1%. The high-K gate dielectric layer 108 is fabricated using tantalum oxide, zirconium oxide, hafnium oxide, aluminum oxide, hafnium silicide or titanium oxide, for example. The high-K gate dielectric layer has a thickness between about 20 Å to 40 Å, for example. The barrier layer 110 is fabricated using hafnium, titanium nitride, tantalum nitride or titanium nitride/titanium, for example. The metal layer 112 is fabricated using aluminum, platinum, tungsten, iridium, molybdenum, molybdenum nitride, nickel, nickel silicide, titanium, titanium nitride, titanium silicide, tantalum or tantalum nitride, for example.

In summary, the present invention includes forming a sacrificial oxide layer over a substrate and then removing the sacrificial oxide layer in a subsequent process to prevent any damages due to plasma treatment in the conventional method. Hence, high-quality interface layer can be produced. Furthermore, the nitridation treatment process in the present invention produces a nitrogen concentration profile having a peak concentration in the sacrificial oxide layer. Therefore, after removing the sacrificial oxide layer, the amount of nitrogen in the substrate falls off substantially so that the control over the distribution of nitrogen is improved and the drop in electron mobility is minimized. Besides, the concentration of nitrogen within the substrate is smaller so that the concentration of nitrogen in the interface layer also decreases correspondingly. Ultimately, the equivalent oxide thickness (EOT) of the interface layer is reduced and the performance of the device is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a gate structure, comprising:
   forming a sacrificial oxide layer over a substrate;
   performing a nitridation treatment process;
   removing the sacrificial oxide layer;
   performing a re-oxidation process to form an interface layer on the surface of the substrate;
   forming a high dielectric constant (K) gate dielectric layer, a barrier layer and a metal layer in sequence over the interface layer; and
   defining the metal layer, the barrier layer, the high-K gate dielectric layer and the interface layer to form a stacked gate structure.

2. The method of claim 1, wherein the nitridation treatment process comprises a plasma nitridation treatment process.

3. The method of claim 1, wherein the interface layer has a nitrogen concentration profile that progressively decreases toward the substrate.

4. The method of claim 1, wherein the interface layer comprises a silicon oxynitride layer.

5. The method of claim 1, wherein the interface layer has a thickness smaller than 7 Å.

6. The method of claim 1, wherein the nitrogen content in the interface layer is between 0.5~5% by weight.

7. The method of claim 1, wherein the material constituting the high-K gate dielectric layer comprises tantalum oxide ($Ta_2O_5$), zirconium oxide ($ZrO_2$), hafnium oxide ($HfO_2$), aluminum oxide ($Al_2O_3$), hafnium silicide (HfSi) and titanium oxide ($TiO_2$).

8. The method of claim 1, wherein the high-K gate dielectric layer has a thickness between 20 Å~40 Å.

9. The method of claim 1, wherein the material constituting the metal layer comprises aluminum (Al), platinum (Pt), tungsten (W), iridium (Ir), molybdenum (Mo), molybdenum nitride (MoN), nickel (Ni), nickel silicide (NiSi), titanium (Ti), titanium nitride (TiN), titanium silicide (TiSi), tantalum (Ta) and tantalum nitride (TaN).

10. The method of claim 1, wherein the material constituting the barrier layer comprises hafnium (Hf), titanium nitride (TiN), tantalum nitride (TaN) and titanium nitride/titanium (TiN/Ti).

11. The method of claim 1, wherein the sacrificial oxide layer has a thickness between 10 Å~40 Å.

12. A method of fabricating a gate structure, comprising:
    forming a sacrificial oxide layer over a substrate;
    performing a nitridation treatment process;
    removing a part of the sacrificial oxide layer;
    performing a re-oxidation process to the sacrificial oxide layer and the surface of the substrate so as to form an interface layer on the substrate;
    forming a high dielectric constant (K) gate dielectric layer, a barrier layer and a metal layer in sequence over the interface layer; and
    defining the metal layer, the barrier layer, the high-K gate dielectric layer and the interface layer to form a stacked gate structure.

13. The method of claim 12, wherein the nitridation treatment process comprises a plasma nitridation treatment process.

14. The method of claim 12, wherein the interface layer has a nitrogen concentration profile that progressively decreases toward the substrate.

15. The method of claim 12, wherein the interface layer comprises a silicon oxynitride layer.

16. The method of claim 12, wherein the interface layer has a thickness smaller than 7 Å.

17. The method of claim 12, wherein the nitrogen content in the interface layer is between 0.5~5% by weight.

18. The method of claim 12, wherein the material constituting the high-K gate dielectric layer comprises tantalum oxide ($Ta_2O_5$), zirconium oxide ($ZrO_2$), hafnium oxide ($HfO_2$), aluminum oxide ($Al_2O_3$), hafnium silicide (HfSi) and titanium oxide ($TiO_2$).

19. The method of claim 12, wherein the high-K gate dielectric layer has a thickness between 20 Å~40 Å.

20. The method of claim 12, wherein the material constituting the metal layer comprises aluminum (Al), platinum (Pt), tungsten (W), iridium (Ir), molybdenum (Mo), molybdenum nitride (MoN), nickel (Ni), nickel silicide (NiSi), titanium (Ti), titanium nitride (TiN), titanium silicide (TiSi), tantalum (Ta) and tantalum nitride (TaN).

21. The method of claim 12, wherein the material constituting the barrier layer comprises hafnium (Hf), titanium nitride (TiN), tantalum nitride (TaN) and titanium nitride/titanium (TiN/Ti).

22. The method of claim 1, wherein the sacrificial oxide layer has a thickness between 10 Å~40 Å.

* * * * *